United States Patent
Han et al.

(10) Patent No.: US 12,289,082 B2
(45) Date of Patent: Apr. 29, 2025

(54) SINGLE-END-TO-DIFFERENTIAL MICROPHONE CIRCUIT

(71) Applicant: AAC ACOUSTIC TECHNOLOGIES (SHENZHEN) CO., LTD., Shenzhen (CN)

(72) Inventors: Dong Han, Singapore (SG); Chuationg Kee, Singapore (SG)

(73) Assignee: AAC ACOUSTIC TECHNOLOGIES (SHENZHEN) CO., LTD., Shenzhen (CN)

( * ) Notice: Subject to any disclaimer, the term of this patent is extended or adjusted under 35 U.S.C. 154(b) by 0 days.

(21) Appl. No.: 17/918,894

(22) PCT Filed: May 19, 2022

(86) PCT No.: PCT/CN2022/093937
§ 371 (c)(1),
(2) Date: Oct. 13, 2022

(87) PCT Pub. No.: WO2023/201824
PCT Pub. Date: Oct. 26, 2023

(65) Prior Publication Data
US 2025/0038713 A1    Jan. 30, 2025

(30) Foreign Application Priority Data

Apr. 19, 2022 (CN) .......................... 202210410727.1

(51) Int. Cl.
H03F 3/183 (2006.01)
H04R 3/00 (2006.01)
H04R 19/04 (2006.01)

(52) U.S. Cl.
CPC ............... *H03F 3/183* (2013.01); *H04R 3/00* (2013.01); *H04R 19/04* (2013.01); *H03F 2200/03* (2013.01); *H04R 2201/003* (2013.01)

(58) Field of Classification Search
CPC ....... H03F 3/183; H03F 2200/03; H04R 3/02; H04R 3/00; H04R 17/02; H04R 19/04; H04R 2201/003
(Continued)

(56) References Cited

U.S. PATENT DOCUMENTS 8,610,497 B2 * 12/2013 Kropfitsch ................ H03F 1/56
                                                        330/109
9,699,551 B2 *  7/2017 Yang ........................ H04R 3/00

FOREIGN PATENT DOCUMENTS

CN   112073013 A  * 12/2020
CN   112398453 A  *  2/2021  ............... H03F 1/38
(Continued)

*Primary Examiner* — David L Ton
(74) *Attorney, Agent, or Firm* — Wiersch Law Group

(57) ABSTRACT

The present invention provides a single-end-to-differential microphone circuit, including a power supply end for inputting a first bias voltage, a microphone capacitor, a coupling capacitor, a first primary amplifier, a second primary amplifier, a signal processing module, current sharing amplifier, a feedback resistor at positive end, a feedback capacitor at positive end, a feedback resistor at negative end, a feedback capacitor at negative end. Compared with the prior art, the single-end-to-differential microphone circuit of the present invention can utilize the current sharing amplifier with a small input common mode voltage range and low noise to realize the single-end-to-differential of the signal, which is beneficial to improve the signal to noise ratio of the circuit.

9 Claims, 4 Drawing Sheets

(58) Field of Classification Search
USPC .......................... 381/111, 113, 114, 174–176
See application file for complete search history.

(56) References Cited

FOREIGN PATENT DOCUMENTS

| | | | | | |
|---|---|---|---|---|---|
| CN | 113225024 | A | * | 8/2021 | ............... H03F 1/26 |
| CN | 114039602 | B | * | 4/2022 | |
| WO | WO-2023201829 | A1 | * | 10/2023 | ............... H03F 1/26 |

\* cited by examiner

SINGLE-END-TO-DIFFERENTIAL MICROPHONE CIRCUIT

TECHNICAL FIELD

The invention relates to the field of electro-acoustic conversion, in particular to a single-end-to-differential microphone circuit.

RELATED BACKGROUND TECHNOLOGY

The MEMS (microelectromechanical systems, microelectromechanical systems) microphone is a microphone based on MEMS sensor technology. It has improved noise elimination performance, good radio frequency performance and electromagnetic interference suppression ability. It is widely used in smart phones, wire-controlled headphones, tablets and laptops and other electronic products. In order to reduce external electromagnetic interference and improve signal transmission quality, in the related art, the single-ended signal output by the MEMS microphone is usually converted into a differential signal for transmission.

As shown in FIG. 1, in the traditional single-end-to-differential microphone circuit, the MEMS output end of the microphone is directly connected to the positive input end of the fully differential amplifier AMP. The compensation capacitor $C_{DMY}$ is connected to the negative input end of the fully differential amplifier AMP. However, due to the limitation of the structure of the MEMS microphone itself, the substrate of the sensor can produce a large parasitic capacitance to the ground, resulting in the vibration amplitude of the signal output by the substrate being smaller than the vibration amplitude of the signal output by the signal end of the sensor. In the equivalent circuit, the signal output by the substrate is transmitted to the negative input end of the fully differential amplifier AMP, and the signal end of the sensor is transmitted to the positive input end of the fully differential amplifier AMP. Therefore, there is a difference in the vibration amplitude of the signal at the positive negative input end of the fully differential amplifier, and the phase is opposite, which is a non-ideal differential signal, resulting in a larger vibration amplitude for the positive and negative common mode voltage at the input end. This requires that the fully differential amplifier AMP must be an amplifier with a large input common mode voltage range to ensure that the fully differential amplifier AMP can work normally. However, the noise of such fully differential amplifiers is usually large, which is not conducive to improving the signal to noise ratio of the circuit.

Therefore, it is necessary to provide a new single-end-to-differential microphone circuit to solve the above technical problems.

SUMMARY OF THE INVENTION

The purpose of the present invention is to provide a single-end-to-differential microphone circuit, which can use a current sharing amplifier with a small input common mode voltage range and low noise to realize the single-end-to-differential of the signal, which is beneficial to improve the signal to noise ratio of the circuit.

The microphone circuit of the present invention includes a power supply end for inputting first bias voltage, a microphone capacitor, a coupling capacitor, a first primary amplifier, a second primary amplifier, a signal processing module, a current sharing amplifier, a feedback resistor at positive end, a feedback capacitor at positive end, a feedback resistor at negative end, a feedback capacitor at negative end, a first output end, and a second output end. The microphone and the coupling capacitor are respectively connected with the first primary input end of the amplifier and the second primary input end of the amplifier. The first primary output end of the amplifier and the second primary output end of the amplifier are respectively connected to the positive input end and the negative input end of the signal processing module. The positive output end and the negative output end of the signal processing module are respectively connected to the positive input end and the negative input end of the current sharing amplifier. The signal processing module adjusts the output signals of the first primary amplifier and the second primary amplifier to a target differential signal with equal vibration amplitude and adverse phase, and outputs the target differential signal to the current sharing amplifier. In this way, a differential signal with equal vibration amplitude and adverse phase can be output through the function of the signal processing module, so that the output of the differential signal can be realized by using the current sharing amplifier with a smaller input common mode voltage range and less noise, which is beneficial to improve the signal to noise ratio of the circuit.

DETAILED DESCRIPTION OF EXEMPLARY EMBODIMENT

The present disclosure will hereinafter be described in detail with reference to exemplary embodiments. To make the technical problems to be solved, technical solutions and beneficial effects of the present disclosure more apparent, the present disclosure is described in further detail together with the figures and the embodiments. It should be understood the specific embodiments described hereby are only to explain the disclosure, not intended to limit the disclosure.

Figure 1:
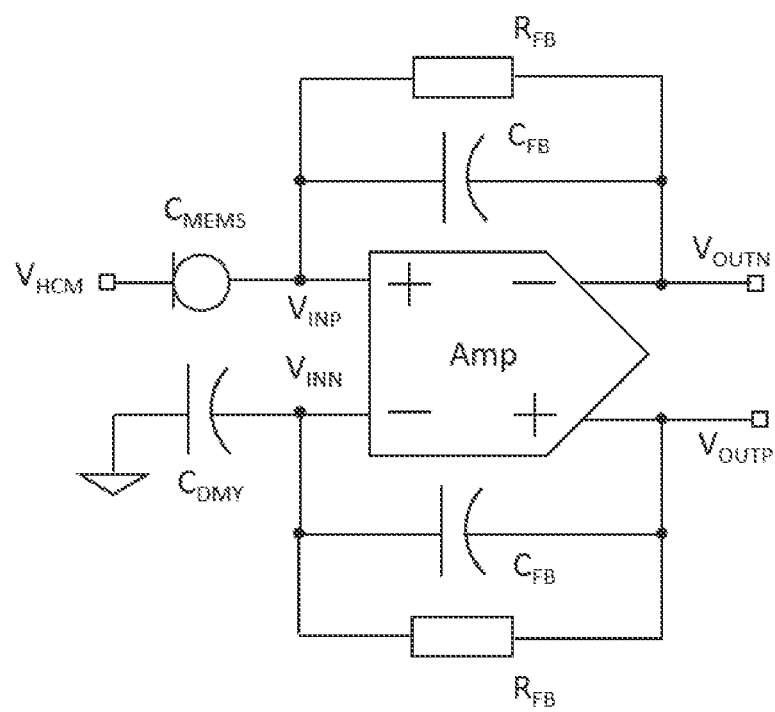
FIG. 1 is a circuit of a single-end-to-differential microphone circuit in a related art.
Figure 2:
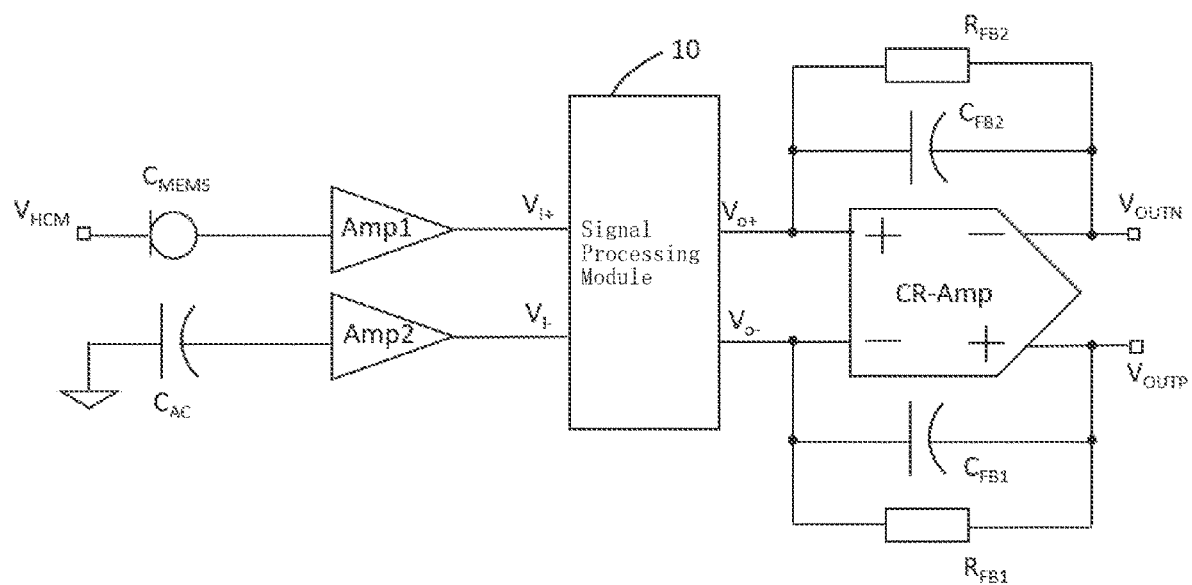
FIG. 2 is a circuit of a single-end-to-differential microphone circuit provided by an embodiment of the present invention.

Please refer to FIG. 2, in the single-end-to-differential microphone circuit of the present invention, the microphone circuit includes a power supply end $V_{HCM}$ for inputting the first bias voltage, a microphone capacitor $C_{MEMS}$, a coupling capacitor $C_{AC}$, a first primary amplifier AMP1, a second primary amplifier AMP2, a signal processing module 10, a current sharing amplifier CR-AMP, a feedback resistor at positive end $R_{FB1}$, a feedback capacitor at positive end $C_{FB1}$, a feedback resistor at negative end $R_{FB2}$ and a feedback capacitor at negative end $C_{FB2}$. Wherein, the microphone capacitor $C_{MEMS}$ is equivalently formed when the microphone is connected to the single-end-to-differential microphone circuit.

The power supply end $V_{HCM}$ is connected to the bias voltage input end of the microphone capacitor $C_{MEMS}$, thereby providing the first bias voltage for the microphone capacitor $C_{MEMS}$. The first bias voltage is a high voltage bias voltage, such as 13.8v. The output end of the microphone capacitor $C_{MEMS}$ is connected to the input end of the first primary amplifier AMP1.

The coupling capacitor $C_{AC}$ is grounded, and the negative pole of the coupling capacitor $C_{AC}$ is connected to the input end of the second primary amplifier AMP2.

The output end of the first primary amplifier AMP1 is connected to the positive input end $V_{I+}$ of the signal processing module 10. The output end of the second primary amplifier AMP2 is connected to the negative input end $V_{I-}$ of the signal processing module 10. The positive output end $V_{O+}$ of the signal processing module 10 is connected to the positive input end of the current sharing amplifier CR-AMP. The negative output end $V_{O-}$ of the signal processing module 10 is connected to the negative input end of the current sharing amplifier CR-AMP. The signal processing module 10 adjusts the output signals of the first primary amplifier AMP1 and the second primary amplifier AMP2 to a target differential signal with equal vibration amplitude and adverse phase, and outputs the target differential signal to the current sharing amplifier CR-AMP.

The feedback resistor at positive end $R_{FB1}$ and the feedback capacitor at positive end $C_{FB1}$ are both connected in parallel between the positive input end and the negative output end $V_{OUTN}$ of the current sharing amplifier CR-AMP. The feedback resistor at negative end $R_{FB2}$ and the feedback capacitor at negative end $C_{FB2}$ are both connected in parallel between the negative input end and the positive output end $V_{OUTP}$ of the current sharing amplifier CR-AMP. Wherein, the resistance values of the feedback resistor at positive end $R_{FB1}$ and the feedback resistor at negative end $R_{FB2}$ may be the same. The capacitance value of the feedback capacitor at positive end $C_{FB1}$ and the feedback capacitor at negative end $C_{FB2}$ may be the same.

Therefore, in the single-end-to-differential microphone circuit of this embodiment, the current sharing amplifier CR-AMP is a fully differential amplifier with double-ended input and double-ended output, and the single-end-to-differential of the signal is realized through the function of the current sharing amplifier CR-AMP. Wherein, through the function of the signal processing module 10, the output signals of the first primary amplifier AMP1 and the second primary amplifier AMP2 are adjusted to target differential signals with equal vibration amplitude and adverse phases. As a result, the differential signal amplitude input to the fully differential amplifier in the subsequent circuits can be equal and the phases are adverse. Therefore, the input common mode voltage range can be reduced, so the fully differential amplifier in the subsequent circuit can be implemented by using the current sharing amplifier CR-AMP with a small input common mode voltage range. The current sharing amplifier CR-AMP has less noise than the fully differential amplifier with a large input common mode voltage range. Therefore, the influence of the noise of the current sharing amplifier CR-AMP itself on the entire circuit can be reduced, which is beneficial to improve the signal to noise ratio of the microphone circuit.

The signal processing module 10 of the present invention includes a signal multiplier. The signal multiplier is specifically configured to subtract the output signal of the second primary amplifier AMP2 from the output signal of the first primary amplifier AMP1 to obtain the difference signal. The difference signal is then subjected to inversion processing to obtain a difference inversion signal. The difference signal and the difference inversion signal constitute the target differential signal. It is also used for outputting the difference signal from the positive output end of the signal processing module 10, and outputting the difference inversion signal from the negative output end of the signal processing module 10.

Therefore, through the signal multiplier, the output signals of the first primary amplifier AMP1 and the second primary amplifier AMP2 can be adjusted to a target differential signal with equal vibration amplitude and adverse phase. And the difference in vibration amplitude between the two signals of the target differential signal is doubled compared to the difference in vibration amplitude before adjustment. It is beneficial to reduce the influence of the current sharing amplifier in the subsequent circuit on the signal to noise ratio of the entire circuit.

Figure 3:
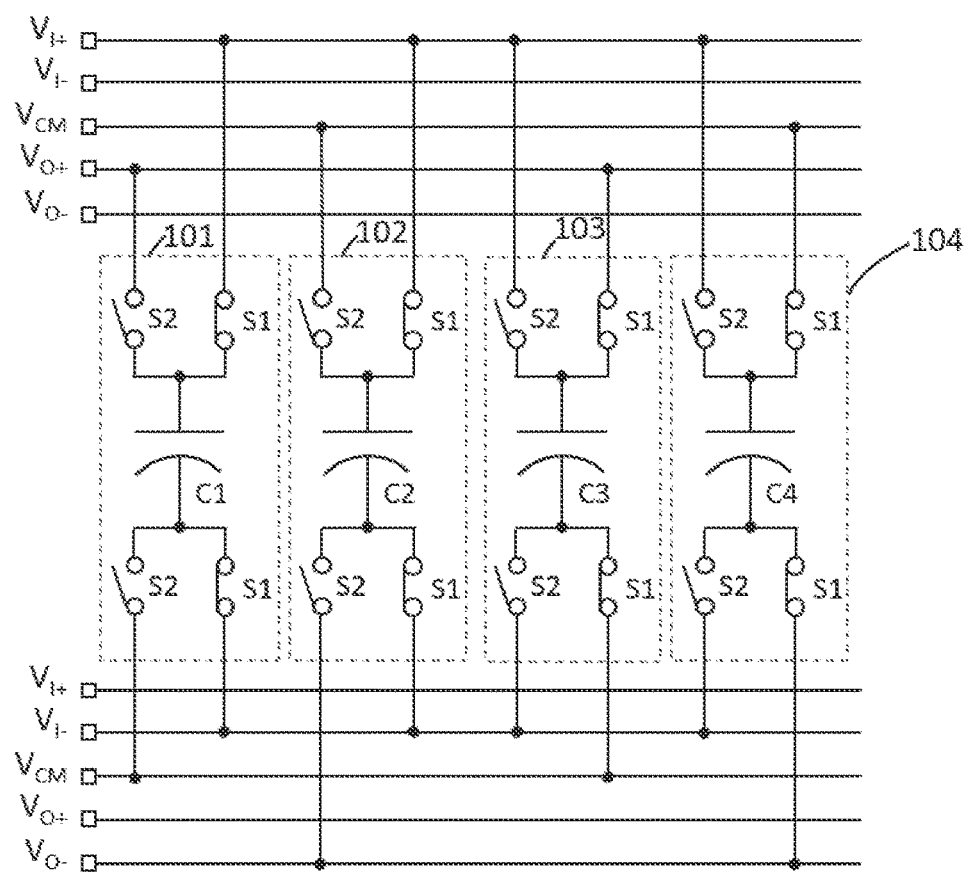
FIG. 3 is a circuit of a signal multiplier provided by the embodiment of the present invention.

More specifically, referring to FIG. 3, in the embodiment of the present invention, the signal multiplier includes four switch capacitors. Each of the switch capacitors includes two first switches s1, two second switches s2, and one capacitor. Four switch capacitors are respectively a first switch capacitor 101, a second switch capacitor 102, a third switch capacitor 103 and a fourth switch capacitor 104;

Wherein, the positive pole of the capacitor C1 of the first switch capacitor 101 is connected to the positive input end $V_{I+}$ of the signal processing module 10 through the first switch s1, and is connected to the signal through the second switch s2 the positive output end $V_{O+}$ of the processing module 10. The capacitor C1 is connected to the negative input end $V_{I-}$ of the signal processing module 10 through the other first switch s1, and is connected to the input common mode voltage $V_{CM}$ through the other second switch s2.

Positive end of the capacitor C2 of the second switch capacitor 102 is connected to the positive input end $V_{I+}$ of the signal processing module 10 through the first switch s1, and connected to the input common mode voltage $V_{CM}$.

Through one of the second switch S2 Negative end of the capacitor C2 is connected to the negative input end $V_{I-}$ of the signal processing module 10 through the other first switch S1, the negative output end $V_{O-}$ of the signal processing module 10 through the other second switch S2.

The positive end of the capacitor C3 of the third switch capacitor 103 is connected to the positive output end $V_{O+}$ of the signal processing module 10 through the first switch S1, and connected to the positive input end $V_{I+}$ of the signal processing module 10 through the second switch S2. The negative end of the capacitor C3 is connected to the input common mode voltage $V_{CM}$ through the other first switch S1, the negative input end $V_{I-}$ of the signal processing module 10 through the other second switch S2.

The capacitor C4 of the fourth switch capacitor 104 is connected to the input common mode voltage $V_{CM}$ through a first switch S1, and connected to the positive input end $V_{I+}$ of the signal processing module 10 through the second switch S2. the capacitor C4 is connected to the negative output end $V_{O-}$ of the signal processing module 10 through the other first switch S1, the negative input end $V_{I-}$ of the signal processing module 10 through the other second switch S2.

All the first switch S1 and the second switch S2 are controlled by a set clock signal. When the clock signal is the first phase S01, all the first switches S1 are closed, and all the second switches S2 are opened. When the clock signal is the second phase s02 adverse to the first phase S01, all the first switches S1 are closed, and all the second switches S2 are open.

Figure 4A:
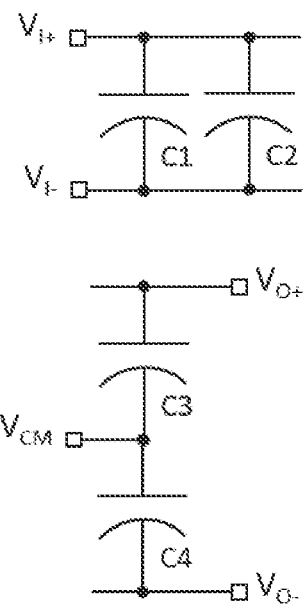
FIG. 4a is an equivalent circuit diagram of the signal multiplier shown in FIG. 3 when a clock signal is a first phase.
Figure 4B:
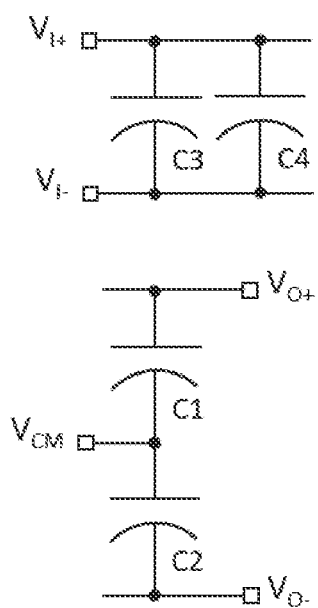
FIG. 4b is an equivalent circuit diagram of the signal multiplier shown in FIG. 3 when the clock signal is a second phase.

As shown in FIGS. 4a-4b, FIG. 4a is an equivalent circuit diagram of the signal multiplier shown in FIG. 3 when the clock signal is first phase S01. FIG. 4b is an equivalent circuit diagram of the signal multiplier shown in FIG. 3 when the clock signal is second phase S02. In the first phase S01, capacitor C1 and capacitor C2 are connected in parallel between positive input end $V_{I+}$ and negative input end $V_{I-}$ of signal processing module 10, the capacitor C3 and the capacitor C4 are connected in series between positive output end $V_{O+}$ o and negative output end $V_{O-}$ of signal processing module 10 At this time, the voltage difference between two ends of the capacitor C1 and the capacitor C2 is the voltage difference between the positive input end $V_{I+}$ and the negative input end $V_{I-}$, that is, the difference signal between the output signals of the first primary amplifier AMP1 and the second primary amplifier AMP2. In the second phase S02, the capacitor C1 and the capacitor C2 are connected in series between the positive output end $V_{O+}$ and the negative output end $V_{O-}$ of signal processing module 10. Therefore, voltage difference across of two ends of the capacitor C1 during first phases 01 and the voltage difference of two ends of the capacitor C2 in the first phases 01 is superimposed between positive output end $V_{O+}$ and negative output end $V_{O-}$. The signal at the negative output end $V_{O-}$ changes to the voltage difference between at two ends of the capacitor C1 plus input common mode voltage, namely $V_{O+}=V_{CM}+V_{I+}-V_{I-}$.

The signal at the negative output end $V_{O-}$ becomes the input common mode voltage $V_{CM}$ minus the voltage difference of two ends of the capacitor C2, that is $V_{O-}=V_{Cm}-(V_{I+}-V_{I-})$. Therefore, the signal of the positive output end $V_{O+}$ and the signal of the negative output end $V_{O-}$ constitute the target differential signal which are transmitted to the positive negative input ends of the current sharing amplifier CR-AMP. And, $v_{o+}-v_{o-}=(v_{cm}+v_{i+}-v_{i-})-(v_{cm}-(v_{i+}-v_{i-}))=2(v_{i+}-v_{i-})$, that is, the positive and negative vibration amplitude difference of target differential signal become two times of the vibration amplitude difference of the output signal of the first primary amplifier AMP1 and the second primary amplifier AMP2, in this way, the difference in vibration amplitude is doubled.

Wherein, the working principle of capacitor C3 and capacitor C4 is similar to that of capacitor C1 and capacitor C2, and the two control clock phases are opposite to each other. Through the capacitor C1, capacitor C2, capacitor C3 and capacitor C4 under the phase complementary clock control, the positive and negative output end of the signal processing module 10 can obtain a continuous difference multiplication signal.

Figure 5:
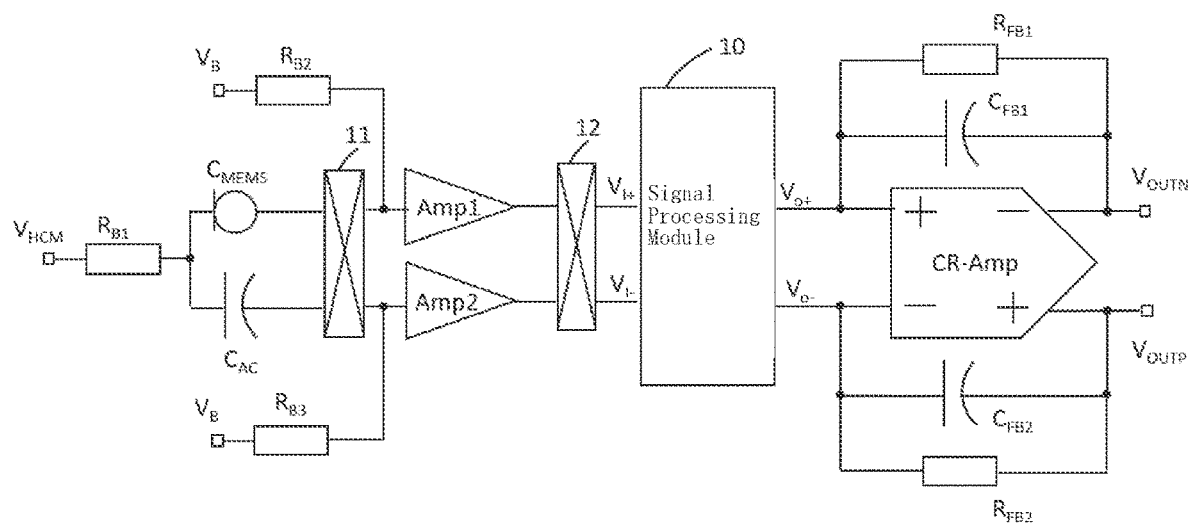
FIG. 5 is another circuit of the single-end-to-differential microphone circuit provided by the embodiment of the present invention.

Referring to FIG. 5, in the embodiment of the present invention, the microphone circuit further includes a first chopper switch 11 and a second chopper switch 12.

The first chopper switch 11 is connected in series between the output end of the microphone capacitor $C_{MEMS}$ and the input end of the first primary amplifier AMP1 through an input end and an output end. The first chopper switch 11 is connected in series between the negative electrode of the coupling capacitor $C_{AC}$ and the input end of the second primary amplifier AMP2 through the other input end and the other output end.

The second chopper switch 12 is connected in series between the output end of the first primary amplifier AMP1 and the positive input end $V_{I+}$ of the signal processing module 10 through an input end and an output end. The second chopper switch 12 is connected in series between the output end of the second primary amplifier AMP2 and the negative input end $V_{I-}$ of the signal processing module 10 through the other input end and the other output end.

By perform the chopping process against the signal through the first chopper switch 11 and the second chopper switch 12, the low frequency noise of the first primary amplifier AMP1 and the second primary amplifier AMP2 can be eliminated.

Continue to refer to FIG. 5, in this embodiment, unlike the embodiment shown in FIG. 2, the positive pole of the coupling capacitor $C_{AC}$ can also be connected to the bias voltage input end of the microphone capacitor $C_{MEMS}$. At this time, the microphone circuit further includes a first bias resistor R b1 connected in series between the power supply end $V_{HCM}$ and the bias voltage input end. The first bias resistor RB1 is a large resistance value resistance, and the resistance value can range from 100 GΩ to 200 GΩ, for example.

Further, the microphone circuit also includes second bias resistor $R_{B2}$ and third bias resistor $R_{B3}$.

The second bias resistor $R_{B2}$ is connected to the input end of the first primary amplifier AMP1, and the other end of the second bias resistor $R_{B2}$ is used to input the second bias voltage $V_B$. The third bias resistor $R_{B3}$ is connected to the input end of the second primary amplifier AMP2, and the other end of the third bias resistor $R_{B3}$ is used to input the second bias voltage $V_B$. The first bias voltage is greater than the second bias voltage $V_B$, and the second bias voltage $V_B$ is a low voltage bias voltage, such as 0.8v.

The resistance values of the second bias resistor $R_{B2}$ and the third bias resistor $R_{B3}$ are the same.

The resistance values of the first bias resistor RB1, the second bias resistor RB2, and the third bias resistor RB3 may be the same or different, for example, both may be 200 GΩ.

As shown in FIG. 5, after the sound signal is input from the microphone capacitor $C_{MEMS}$, it is converted into an AC signal through the microphone capacitor $C_{MEMS}$. And due to the high impedance of the first bias resistor $R_{B1}$, the AC signal can be input to the first primary amplifier AMP1 and the second primary amplifier AMP2 at the same time after passing through the first chopper switch 11. Phase of the AC signals input to the first primary amplifier AMP1 and the second primary amplifier AMP2 are adverse. After the chopping processing of the first chopper switch 11 and the second chopper switch 12, the low frequency noise of the first primary amplifier AMP1 and the second primary amplifier AMP2 can be eliminated. Then, the signal processed by the second chopper switch 12 is adjusted by the signal processing module 10 to obtain the target differential signal with equal vibration amplitude and adverse phase. In addition, the vibration amplitude of the target differential signal can be increased compared with that before the adjustment, which is beneficial to reduce the influence of the current sharing amplifier on the signal to noise ratio of the entire circuit, and is beneficial to improve the signal to noise ratio.

In addition, when the closed loop gain is 1, the capacitance value of the prior art positive and feedback capacitor at negative end needs to be set to be the same as the capacitance value of the microphone capacitor $C_{MEMS}$. The capacitance value of the microphone capacitor $C_{MEMS}$ is usually small, so the capacitance values of the feedback capacitor at the positive and negative end are small, which reduces the signal to noise ratio of the entire circuit. In this embodiment, the coupling capacitor $C_{AC}$ is connected to the bias voltage input end of the microphone capacitor $C_{MEMS}$.

A first bias resistor $R_{B1}$ is connected in series between the power supply end $V_{HCM}$ and the bias voltage input end of the microphone capacitor $C_{MEMS}$. Therefore, when the closed loop gain is 1, the capacitance value of the feedback capacitor at positive and negative end can be set to twice the capacitance value of the microphone capacitor $C_{MEMS}$. Compared with the existing method, the capacity value of feedback capacitor at positive and negative end can be increased. Thereby, more noise of the current sharing amplifier itself can be filtered out, and the signal to noise ratio of the entire microphone capacitor circuit can be improved.

Figure 6:
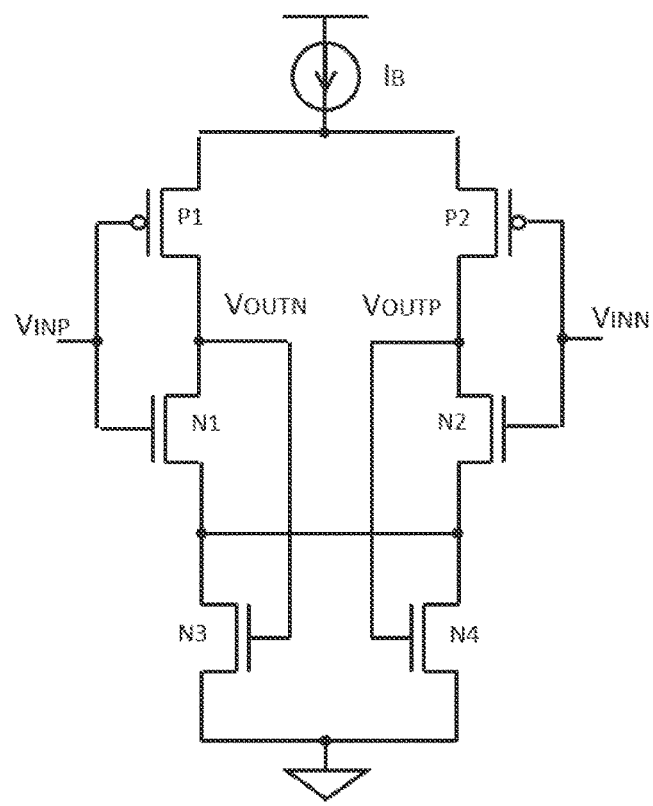
FIG. 6 is a circuit of a current sharing amplifier provided by the embodiment of the present invention.

Referring to FIG. 6, in the embodiment of the present invention, the current sharing amplifier CR-AMP includes a bias current source $I_B$, a first PMOS tube P1, a second PMOS tube P2, a first NMOS tube N1, a second NMOS tube N2, a third NMOS tube N3 and a fourth NMOS tube N4.

The source electrode of the first PMOS tube P1 and the source electrode of the second PMOS tube P2 are both connected to the output end of the bias current source $I_B$. The grid electrode of the first PMOS tube P1 is connected to the grid electrode of the first NMOS tube N1 and together serve as the positive input end $V_{INP}$ of the current sharing amplifier CR-AMP. The drain electrode of the first PMOS tube p1 is connected to the drain electrode of the first NMOS tube N1 and the grid electrode of the third NMOS tube N3 and together serve as the negative output end $V_{OUTN}$ of the current sharing amplifier CR-AMP.

The grid electrode of the second PMOS tube P2 is connected to the grid electrode of the second NMOS tube N2 and together serve as the negative input end of the current sharing amplifier CR-AMP. The drain electrode of the second PMOS tube p2 is connected to the drain electrode of the second NMOS tube N2 and the grid electrode of the fourth NMOS tube N4 and together serve as the positive output end of the current sharing amplifier CR-AMP.

The source electrode of the first NMOS tube N1 is connected to the drain electrode of the third NMOS tube N3, the source electrode of the second NMOS tube N2, and the drain electrode of the fourth NMOS tube N4.

The source electrode of the third NMOS tube n3 and the source electrode of the fourth NMOS tube N4 are both grounded.

Therefore, for the above current sharing amplifier CR-AMP, the transconductances of the first PMOS tube P1 as the input tube and the first NMOS tube n1 are added together and then converted into a voltage output at the negative output end $V_{OUTN}$ after passing through the third NMOS tube N3 as the load. The transconductance of the second PMOS tube P2 and the second NMOS tube N2, which are the input tubes, are added together, and then pass through the fourth NMOS tube N4, which is the load, and then convert to a voltage output at the positive output end $V_{OUTP}$. Therefore, under the same bias current, the transconductance is doubled, which is beneficial to reduce the noise of the current sharing amplifier CR-AMP.

It is to be understood, however, that even though numerous characteristics and advantages of the present exemplary embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms where the appended claims are expressed.

What is claimed is:

1. A single-end-to-differential microphone circuit, including:
   a power supply end for inputting a first bias voltage;
   a microphone capacitor;
   a coupling capacitor;
   a first primary amplifier;
   a second primary amplifier;
   a signal processing module;
   a current sharing amplifier;
   a feedback resistor at a positive end;
   a feedback capacitor at the positive end;
   a feedback resistor at a negative end;
   a feedback capacitor at the negative end; wherein
   the microphone capacitor is equivalently formed when the microphone is connected to the single-end-to-differential microphone circuit;
   the power supply end is connected to a bias voltage input end of the microphone capacitor, and an output end of the microphone capacitor is connected to the first primary input end of the amplifier;
   the coupling capacitor is grounded or connected to the bias voltage input end; and wherein
   the positive electrode of the coupling capacitor is connected to the bias voltage input end, the single-end-to-differential microphone circuit further includes a first bias resistor connected in series between the power supply end and the bias voltage input end; the coupling capacitor is connected to the second primary input end of the amplifier;
   the first primary output end of the amplifier and the second primary output end of the amplifier are respectively connected to the positive input end and the negative input end of the signal processing module; the positive output end and the negative output end of the signal processing module are respectively connected to the positive input end and the negative input end of the current sharing amplifier; the signal processing module adjusts the output signals of the first primary amplifier and the second primary amplifier to a target differential signal with equal vibration amplitude and adverse phase, and outputs the target differential signal to the current sharing amplifier;
   the feedback resistor at the positive end and the feedback capacitor at the positive end are connected in parallel between the positive input end and the negative output end of the current sharing amplifier; the feedback resistor at negative end and the feedback capacitor at negative end are connected in parallel between the negative input end and the positive output end of the current sharing amplifier.

2. The single-end-to-differential microphone circuit as described in claim 1, wherein the signal processing module includes a signal multiplier, and the signal multiplier is used for subtracting the output signal of the second primary amplifier from the output signal of the first primary amplifier to obtain the difference signal; the inversion processing on the difference signal is performed to obtain a difference inversion signal, and the difference signal and the difference inversion signal constitute the target differential signal; the difference signal is output from the positive output end of the signal processing module, and the difference inversion signal is output from the negative output end of the signal processing module.

3. The single-end-to-differential microphone circuit as described in claim 2, wherein
   the signal multiplier includes four switch capacitors; each of the switch capacitors includes two first switches, two second switches and a capacitor; the four switch capacitors are respectively the first switch capacitor, the second switch capacitor, the third switch capacitor and the fourth switch capacitor;

the positive electrode of the capacitor of the first switch capacitor is connected to the positive input end of the signal processing module through one of the first switches connected to the positive output end of the signal processing module through a second switch;

the negative terminal of the capacitor is connected to the negative input end of the signal processing module through the other first switch, and connected to input common mode voltage through the other second switch;

the positive pole of the capacitor of the second switch capacitor is connected to the positive input end of the signal processing module through one of the first switch, and is connected to the input common mode voltage through one of the second switch, the negative terminal of the capacitor is connected to the negative input end of the signal processing module through the other first switch, connected to the negative output end of the signal processing module through the other second switch;

the positive pole of the capacitor of the third switch capacitor is connected to the positive output end of the signal processing module through the first switch, and connected to the positive input end of the signal processing module through a second switch; the negative pole of the capacitor is connected to the input common mode voltage through the other first switch, and connected to the negative input end of the signal processing module through the other second switch;

the positive electrode of the capacitor of the fourth switch capacitor is connected to the input common mode voltage through the first switch, and is connected to the positive input end of the signal processing module through the second switch;

the capacitor is connected to the negative output end of the signal processing module through the other first switch, and is connected to the negative input end of the signal processing module through the other second switch;

all the first switch and the second switch are controlled by the set clock signal: when the clock signal is in the first phase, all the first switches are closed, and all the second switches are open; when the clock signal is the second phase adverse to the first phase, all the first switches are closed, and all the second switches are open.

4. The single-end-to-differential microphone circuit as described in claim 1, wherein the single-end-to-differential microphone circuit further includes a first chopper switch and a second chopper switch;

the first chopper switch is connected in series between the output end of the microphone and the first primary input end of the amplifier through an input end and an output end; the first chopper switch is connected in series between the negative pole of the coupling capacitor and the second primary input end of the amplifier, through the other input end and the other output end;

the second chopper switch is connected in series between the first primary output end of the amplifier and the positive input end of the signal processing module through an input end and an output end; the second chopper switch is connected in series between the second initial output end of the amplifier and the negative input end of the signal processing module, through the other input end and the other output end.

5. The single-end-to-differential microphone circuit as described in claim 1, wherein the current sharing amplifier includes a bias current source, a first PMOS tube, a second PMOS tube, a first NMOS tube, a second NMOS tube, a third NMOS tube and a fourth NMOS tube;

the source electrode of the first PMOS tube and the source electrode of the second PMOS tube are connected to the output end of the bias current source; the grid electrode of the first PMOS tube is connected to grid electrode of the first NMOS tube and together serve as the positive input end of the current sharing amplifier; the drain electrode of the first PMOS tube is connected to the drain electrode of the first NMOS tube and the grid electrode of the third NMOS tube and together serve as the negative output end of the current sharing amplifier;

the grid electrode of the second PMOS tube is connected to the grid electrode of the second NMOS tube and together serve as the negative input end of the current sharing amplifier; the drain electrode of the second PMOS tube is connected to the drain electrode of the second NMOS tube and the grid electrode of the fourth NMOS tube and together serve as the positive output end of the current sharing amplifier;

the source electrode of the first NMOS tube is connected to the drain electrode of the third NMOS tube, the source electrode of the second NMOS tube, and the drain electrode of the fourth NMOS tube;

the source electrode of the third NMOS tube and the source electrode of the fourth NMOS tube are both grounded.

6. The single-end-to-differential microphone circuit as described in claim 1, wherein the single-end-to-differential microphone circuit further includes a second bias resistor and a third bias resistor;

one end of the second bias resistor is connected to the first primary input end of the amplifier, and the other end of the second bias resistor is used to input the second bias voltage; one end of the third bias resistor is connected to the second primary input end of the amplifier, and the other end of the third bias resistor is used to input the second bias voltage.

7. The single-end-to-differential microphone circuit as described in claim 6, wherein the first bias voltage is greater than the second bias voltage.

8. The single-end-to-differential microphone circuit as described in claim 7, wherein the resistance value of the first bias resistor ranges from 100 GΩ to 200 GΩ.

9. The single-end-to-differential microphone circuit as described in claim 1, wherein the resistance values of the feedback resistor at positive end and the feedback resistor at negative end are the same; the capacitance values of the feedback capacitor at the positive end and the feedback capacitor at the negative end are the same.

* * * * *